United States Patent [19]
Reyes et al.

[11] Patent Number: 5,498,988
[45] Date of Patent: Mar. 12, 1996

[54] LOW POWER FLIP-FLOP CIRCUIT AND METHOD THEREOF

[75] Inventors: Alberto J. Reyes, Phoenix; Steven D. Millman, Mesa; Sean C. Tyler, Chandler, all of Ariz.

[73] Assignee: Motorola, Inc., Schaumburg, Ill.

[21] Appl. No.: 345,655

[22] Filed: Nov. 25, 1994

[51] Int. Cl.$^6$ ........................................ H03K 3/037
[52] U.S. Cl. ..................... 327/199; 327/225; 327/230
[58] Field of Search ................................. 327/198, 199, 327/201, 218, 219, 225, 230, 200, 202, 210, 211, 212, 213, 362, 185

[56] References Cited

U.S. PATENT DOCUMENTS

| | | | |
|---|---|---|---|
| 4,348,597 | 9/1982 | Weber | 327/198 |
| 4,631,420 | 12/1986 | Hollis et al. | 327/201 |
| 4,864,243 | 9/1989 | Reese | 327/198 |
| 5,144,168 | 9/1992 | Tran | 327/219 |
| 5,233,617 | 8/1993 | Simmons et al. | 327/198 |
| 5,357,144 | 10/1994 | Tanaka | 327/218 |
| 5,410,550 | 4/1995 | Simmons et al. | 327/218 |

*Primary Examiner*—Timothy P. Callahan
*Assistant Examiner*—My-Trang Nu Ton
*Attorney, Agent, or Firm*—Robert D. Atkins

[57] ABSTRACT

A low power flip-flop circuit is disclosed including a clocked flip-flop (10) and switching circuit (40, 60) with control inputs coupled to the data input and data output of the flip-flop to determine whether or not the data input to the flip-flop is changing. Any clock pulse during periods when the data input is not changing consumes power without providing a useful function. The switching circuit passes clock pulses to a clock input of the flip-flop only when new data is present to be latched into the flip-flop, i.e. data input state and data output state disagree. The switching circuit blocks clock pulses to the flip-flop when the data to the flip-flop is not changing and thereby saves power consumption.

16 Claims, 3 Drawing Sheets

5,498,988

LOW POWER FLIP-FLOP CIRCUIT AND METHOD THEREOF

BACKGROUND OF THE INVENTION

The present invention pertains to digital switching circuits and, more particularly, to reducing power dissipation in a flip-flop circuit.

In large modern digital designs, a very common and useful circuit is the flip-flop, which is herein defined to mean any bi-stable circuit having the below described problems incorporated therein. The purpose of a flip-flop is to latch a data value which is present at its input at a time $t_1$, to its output at a later time $t_2$. The latching activity is driven by a clock signal which typically operates at a global clock frequency on the order of megahertz (MHz). The latching mechanism typically requires the clock signal and its complement, hence, a chain of inverters is used to generate these signals internal to the flip-flop.

The total power dissipation ($P_{TOTAL}$) in CMOS circuits is comprised of power due to the charging/discharging of capacitive loads ($P_{CAP}$), short circuit power ($P_{SH}$) due to short circuit current when transistors switch, and leakage power ($P_{IDD}$) due to static leakage current. In particular, the total power for a circuit can be calculated using the following equations:

$$P_{TOTAL} = P_{CAP} + P_{SH} + P_{IDD}$$

$$P_{CAP} = C_L V_{DD}^2 f$$

$$P_{SH} = \frac{V_{DD}}{T} \cdot \int_0^T i_{SH} dt$$

$$P_{IDD} = I_{DD} V_{DD}$$

where:

$C_L$ is the capacitive loading at an output of the circuit, $V_{DD}$ is the supply voltage, f is the frequency of the output (1/T, where T is the cycle time), $I_{SH}$ is the short circuit current, and $I_{DD}$ is the leakage current of the circuit.

The majority of the total power in typical CMOS circuits is due to the capacitive power ($P_{CAP}$), a smaller portion is due to the short circuit power ($P_{SH}$), and a negligible amount is due to the leakage power ($P_{IDD}$). The power due to the charging/discharging of capacitive loads ($P_{CAP}$) occurs when the flip-flop is clocked. The continuous clocking of the flip-flop, even when no new data is present, consumes unnecessary power.

Accordingly, it is desirable to reduce total power dissipation in a flip-flop circuit.

DETAILED DESCRIPTION OF THE PREFERRED EMBODIMENT

Figure 1:
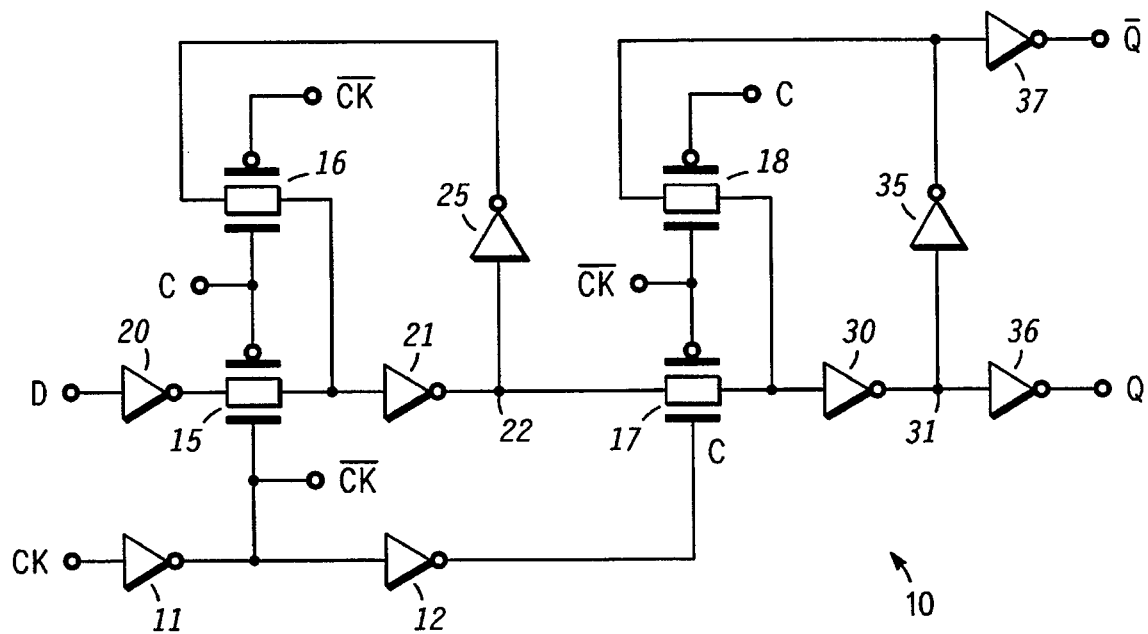
FIG. 1 is a schematic diagram of a D-type CMOS flip-flop.

Referring to FIG. 1, a schematic diagram of a D-type flip-flop 10 is illustrated. Flip-flop 10 includes an external terminal CK adapted to have coupled thereto a single source of externally generated clock pulses. Terminal CK is coupled through a first inverter 11 to a terminal $\overline{CK}$ which supplies internally generated inverted clock pulses to all terminals designated $\overline{CK}$ in the remainder of flip-flop 10. The $\overline{CK}$ pulses are further coupled through a second inverter 12 to a terminal C which supplies internally generated clock pulses to all terminals designated C in the remainder of flip-flop 10. Terminals C and $\overline{CK}$ are designated in this fashion to simplify the figure.

Flip-flop 10 includes four transmission gates 15, 16, 17 and 18. Transmission gates 15 and 18 each have a first control terminal coupled to receive clock pulses and an opposed or inverted control terminal for receiving clock pulses C. Transmission gates 16 and 17 each have a first control input terminal coupled to receive clock pulses C and an opposed or inverted control input terminal for receiving clock pulses $\overline{CK}$. Also, each transmission gate 15–18 includes a data input terminal and a data output terminal and, as is known, data applied to the data input terminal is passed directly to the data output terminal when proper pulses are simultaneously applied to the control and inverted control input terminals.

A data input terminal, designated D, is coupled through an inverter 20 to the data input terminal of transmission gate 15. The data output terminals of transmission gates 15 and 16 are coupled through an inverter 21 to node 22. Node 22 is coupled through an inverter 25 to the data input terminal of transmission gate 16. Node 22 is also coupled to the data input terminal of transmission gate 17, while the data output terminals of transmission gates 17 and 18 are coupled through an inverter 30 to node 31. Node 31 is coupled through an inverter 35 to the data input terminal of transmission gate 18 and through an inverter 36 to a data output terminal, designated Q, for flip-flop 10. The output of inverter 35 is also coupled through a second inverter 37 to an inverted data output terminal, designated $\overline{Q}$, for flip-flop 10.

The latching activity is driven by clock pulses CK which typically are at a frequency on the order of megahertz. Flip-flop 10 clocks data from input D to output Q at the falling edge of CK. Flip-flop 10 requires clock pulse CK and its complement, hence, a chain of inverters 11 and 12 is used to generate clock pulse C and the inverted clock pulse $\overline{CK}$. Also, each time a clock pulse C and an inverted clock pulse $\overline{CK}$ is applied to flip-flop 10 switching of transistors and operation of inverters in the remainder of the circuit takes place. The value of the data applied to data input terminal D generally switches at much lower frequencies than the frequency of clock pulses CK. Empirical results show that data frequency rates are generally less than 10% of the clock frequency rates. Thus, the continual switching of C and CK when data does not change dissipates power in flip-flop 10 without providing any useful function.

Figure 2:
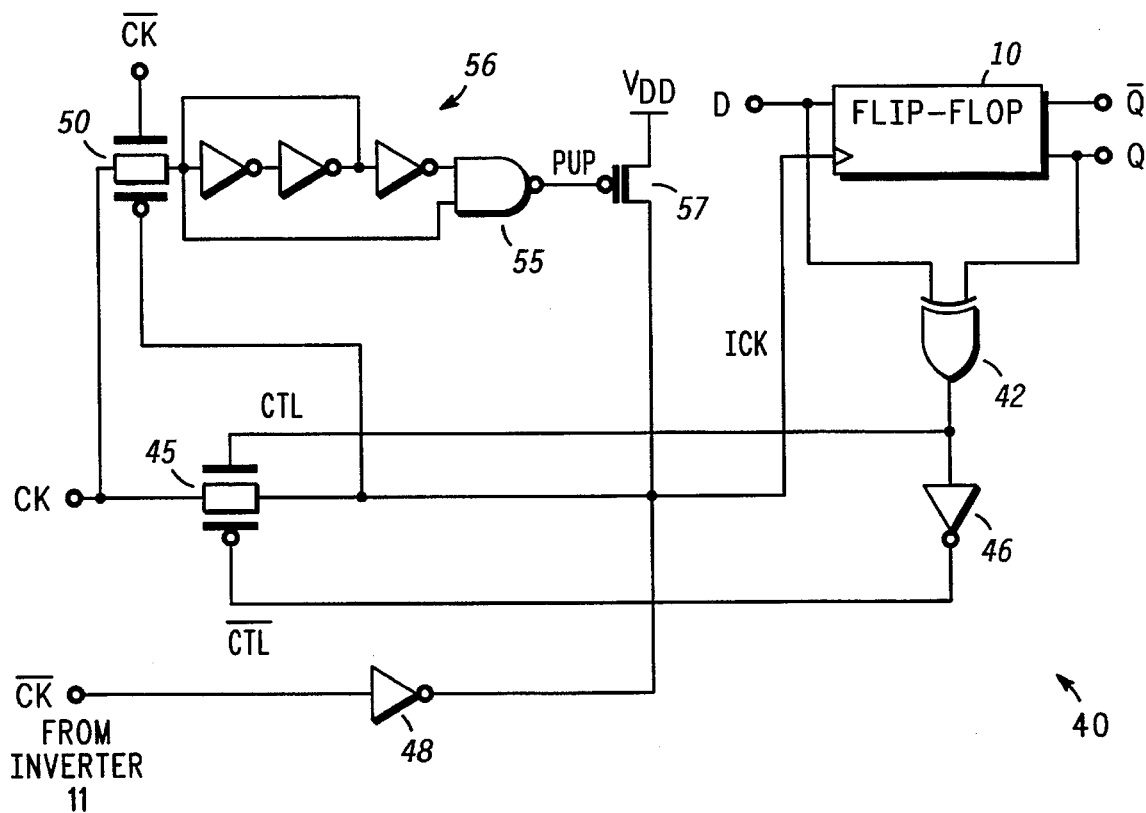
FIG. 2 is a schematic diagram of switching circuitry coupled to the D-type flip-flop of FIG. 1.
Figure 3:
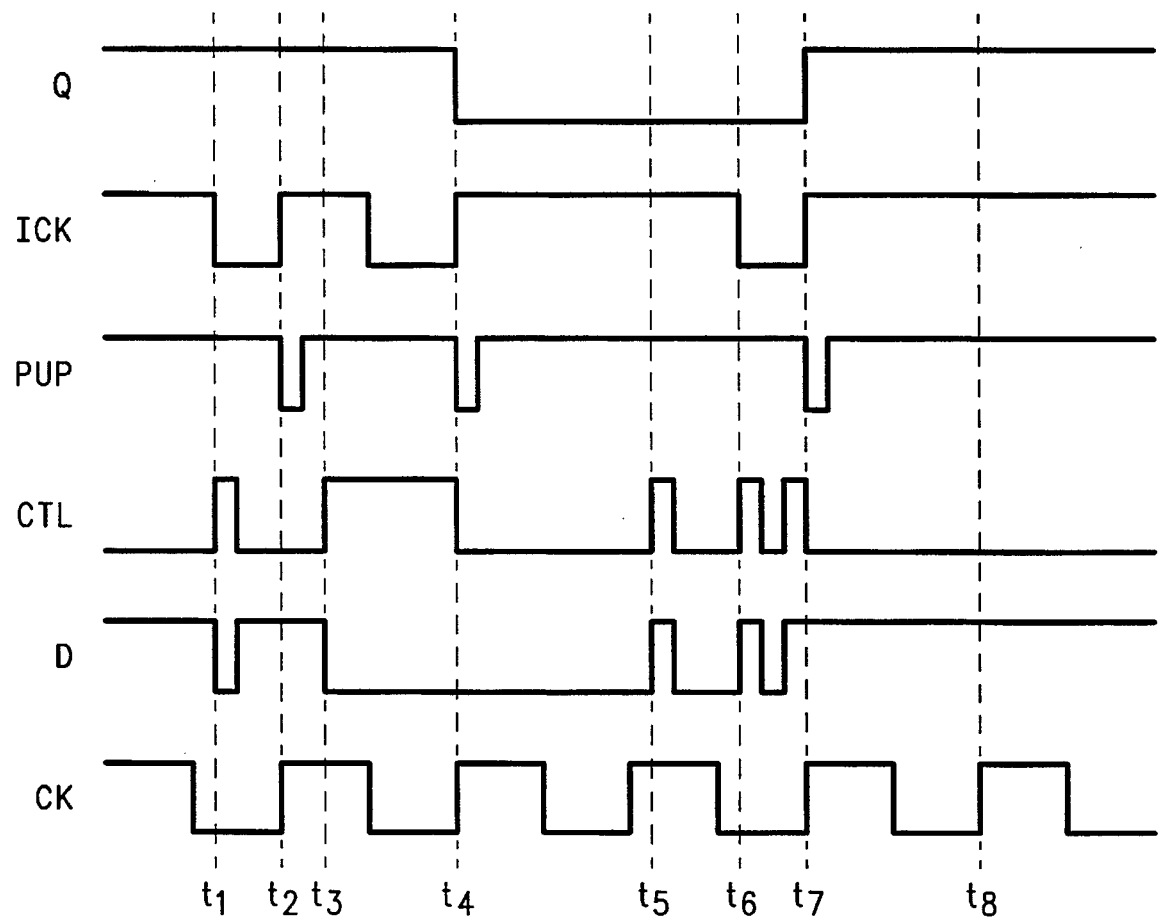
FIG. 3 illustrates a timing diagram for the circuitry of FIG. 2.

Referring to the schematic diagram of FIG. 2, a switching circuit 40 is coupled to D-type flip-flop 10 of FIG. 1 (illustrated in block form) for monitoring data D and output Q and passing clock signal CK as internal clock ICK to inverter 11 in FIG. 1 when data D and output Q disagree, and blocking clock signal CK when data D and output Q agree at the clocking edge of CK, in accordance with the present invention. Switching circuit 40 includes a data sensing circuit, which in this specific embodiment includes a first gate 42 illustrated as an exclusive-OR gate having one data input coupled to data terminal D and another data input terminal coupled to data output terminal Q of flip-flop 10. An output terminal of gate 42 provides control signal CTL to a control input terminal of a second gate 45. An inverter 46 provides a complementary control signal $\overline{CTL}$ to an inverted control input terminal of gate 45. In this specific embodiment, gate 45 is illustrated as a transmission gate but it will be understood that any convenient circuit that can perform the described functions can be utilized. The transmission gates disclosed in the present application may be implemented with back-to-back n-channel and p-channel transistors with the control inputs at the gates of the respective transistors. A data input terminal of gate 45, designated CK, is coupled to receive clock pulses CK. An output data terminal of gate 45 is coupled to the clocking input terminal, which in this embodiment is designated ICK, of flip-flop 10. Internal clock ICK is applied to the input of inverter 11 in FIG. 1. Gate 45 is interposed between clock terminal CK and clock input terminal ICK of flip-flop 10 for passing clock pulses when the data is changing and blocking clock pulses when the data is not changing.

Consider a first example of switching circuit 40 operating where a spurious data signal D to flip-flop 10 occurs at time $t_1$. Data D goes low and returns high during the low portion of CK before flip-flop 10 is clocked at the rising edge of CK. Output Q is not updated until flip-flop 10 receives a falling edge of ICK. During the time that data D is different than output Q, control signal CTL is logic one by nature of the exclusive-OR function of gate 42. The logic one CTL and logic zero $\overline{CTL}$ enable transmission gate 45 to pass clock signal CK. With CK at logic zero, ICK goes to logic zero and $\overline{CK}$ goes to logic one at the output of inverter 11 within flip-flop 10. The spurious data D switches back to logic one before the rising edge of CK at time $t_2$ whereby CTL returns to logic zero because data D again matches output Q. ICK remains at logic zero because inverters 11 and 48 latch its present state. At time $t_2$, ICK clocks flip-flop 10 on its rising edge but output Q remains logic one because data D is logic one at time $t_2$. Thus, a spurious data signal before the clocking edge of CK causes flip-flop 10 to update its contents.

Switching circuit 40 also includes pull-up circuit 56 including transmission gate 50, an NAND gate 55, and a switching transistor 57. A data input terminal of gate 50 is coupled to the clock terminal CK and a data output is coupled to one input of gate 55 while the other input of gate 55 is coupled through an inverting network 56 to the data output of gate 50. A data output terminal of gate 55 is coupled to the gate or control terminal of transistor 57. One current terminal of transistor 57 is coupled to a potential terminal adapted to have a source of potential $V_{DD}$ applied thereto and the other current terminal is coupled to clocking input ICK of flip-flop 10.

Just before time $t_2$, transmission gate 50 is enabled with the low ICK and high $\overline{CK}$. NAND gate 55 receives a logic zero from CK and a logic one from inverting network 56. The first two inverters in inverting network 56 operate as a latch to maintain the logic state at the output of transmission gate 50. At time $t_2$, CK goes to logic one whereby NAND gate 55 receives two logic ones and provides a logic zero PUP to turn on transistor 57 and pull up ICK to logic one.

The pulse width of PUP is one inverter delay, i.e. the third inverter. Generating this pull-up signal serves two purposes. First, when new data needs to be latched into flip-flop 10, the pull-up signal helps pull up clocking terminal ICK of flip-flop 10 during the rising clock pulse. Second, this pull-up signal helps correctly pull up clocking terminal ICK of flip-flop 10 in the presence of dynamic hazards on input data terminal D. As an example, it can happen that dynamic hazards on data input terminal D can cause clocking terminal ICK of flip-flop 10 to go low when the clock CK is low. The pull-up signal ensures that clocking terminal ICK of flip-flop 10 pulls up only when clock CK goes high, thereby ensuring proper data latching. It should be noted that the activity of the pull-up signal generating circuitry is minimized since it only activates for half a clock cycle when the data at data input terminal D changes.

Next consider an example where data D goes low at time $t_3$ and stays low during a rising edge of CK. CTL goes high at time $t_3$ to enable transmission gate 45 and allow ICK to follow CK. New data is present to flip-flop 10 because data D disagrees with output Q. At time $t_4$, CK goes high and the rising edge of ICK clocks flip-flop 10 to latch the new data. Output Q goes to logic zero and CTL returns to logic zero as data D and output Q again agree. Transmission gate 45 becomes disabled and blocks CK. Just before time $t_4$, transmission gate 50 is enabled with the low ICK and high $\overline{CK}$. NAND gate 55 receives a logic zero from CK and a logic one from inverting network 56. At time $t_4$, CK goes to logic one and NAND gate 55 provides a logic zero PUP to turn on transistor 57 and pull up ICK to logic one. Inverters 11 and 48 latch ICK at logic one until the next time transmission gate 45 becomes enabled.

Between times $t_4$ and $t_5$, there is no change in data D. Control signal CTL remains logic zero and transmission gate 45 is an open circuit. At the rising edge of CK before time $t_5$, CK is blocked from flip-flop 10 because data D agrees with output Q, i.e. no new data is present.

Another example begins at time $t_5$ with a first spurious data signal D while CK is high, and another spurious data signal D at time $t_6$, when CK is low. CTL goes to logic one at time $t_5$ because data D disagrees with output Q. Transmission gate 45 is enabled while data D disagrees with output Q, but ICK does not change because CK is high. When data D returns to logic zero during the high portion of CK, it agrees with output Q and CTL goes to logic zero whereby transmission gate 45 becomes disabled. The second time transmission gate 45 is enabled by data D disagreeing with output Q occurs at time $t_6$. ICK goes low because CK is already logic zero. Inverters 11 and 48 hold ICK at logic zero. Data D goes low and returns to logic one and stays there through the rising edge of CK. CTL follows accordingly as data D and output Q agree and disagree. At time $t_7$, the rising edge of ICK clocks flip-flop 10 causing output Q to go to logic one as per data D. CTL returns to logic zero as data D and output Q again agree. Transmission gate 45 becomes disabled and blocks clock signal CK. Just before time $t_7$, transmission gate 50 is enabled with the low ICK and high $\overline{CK}$. NAND gate 55 receives a logic zero from CK and a logic one from inverting network 56. At time $t_7$, CK goes to logic one and NAND gate 55 provides a logic zero PUP to turn on transistor 57 and pull up ICK to logic one. Inverters 11 and 48 latch ICK at logic one until the next time transmission gate 45 becomes enabled.

The rising edge of CK at time $t_8$ has no effect on flip-flop 10 because data D agrees with output Q, i.e. no new data is present. CTL remains logic zero and transmission gate 45 blocks clock signal CK from reaching flip-flop 10. By not clocking flip-flop 10 unless new data is present, the capacitive power dissipation in flip-flop 10 is reduced.

Figure 4:
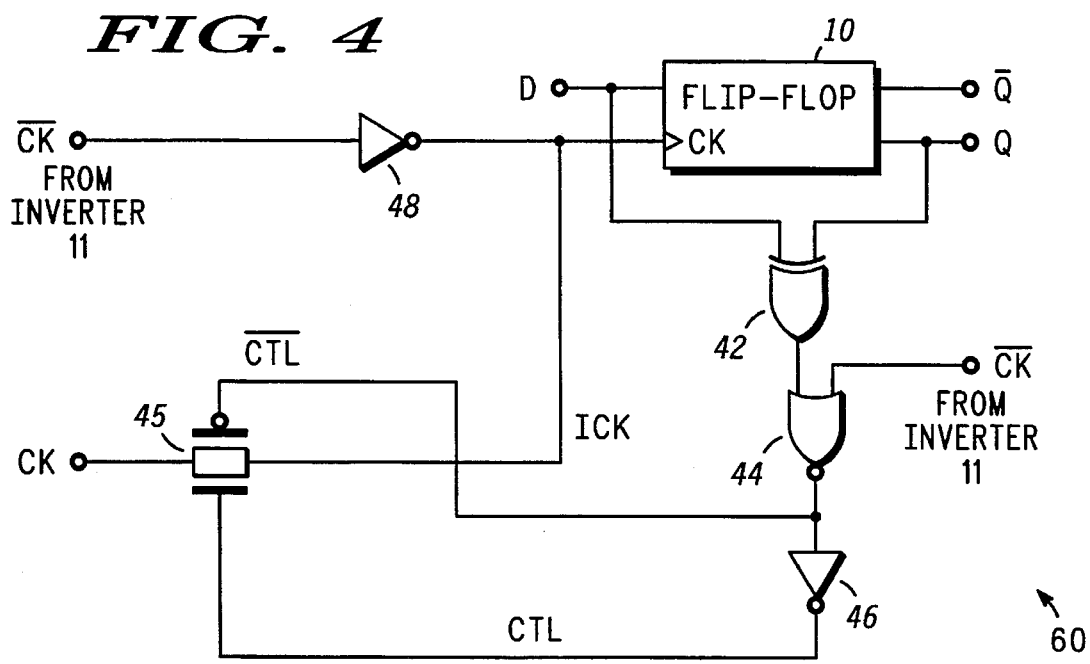
FIG. 4 is a schematic diagram of an alternate embodiment of the switching circuitry.

An alternate embodiment of the present invention is shown in FIG. 4. Switching circuit 60 is coupled to D-type flip-flop 10 of FIG. 1 for monitoring data D and output Q and passing clock signal CK as internal clock ICK to inverter 11 when data D and output Q disagree, and blocking clock signal CK when data D and output Q agree at the clocking edge of CK in accordance with the present invention Components having a similar function are assigned the same reference number used in FIG. 2. Switching circuit 60 includes a data sensing circuit, which in this specific embodiment includes an exclusive-OR gate 42 and a NOR gate 44. Gate 42 has one data input coupled to data terminal D and another data terminal coupled to data output terminal Q of flip-flop 10. NOR gate 44 has one data input terminal coupled to the output terminal of gate 42 and another data terminal coupled to inverted clock input terminal $\overline{CK}$. The output terminal of gate 44 is coupled to an inverted control input terminal of transmission gate 45 and through an inverter 46 to a control input terminal of gate 45. A data input terminal of gate 45, designated CK, is coupled to receive clock pulses CK. An output data terminal of gate 45 is coupled to the clocking input terminal, which in this embodiment is designated ICK, of flip-flop 10. Thus, gate 45 is interposed between clock terminal CK and clock input terminal ICK of flip-flop 10 for passing clock pulses when the data is changing and blocking clock pulses when the data is not changing.

Figure 5:
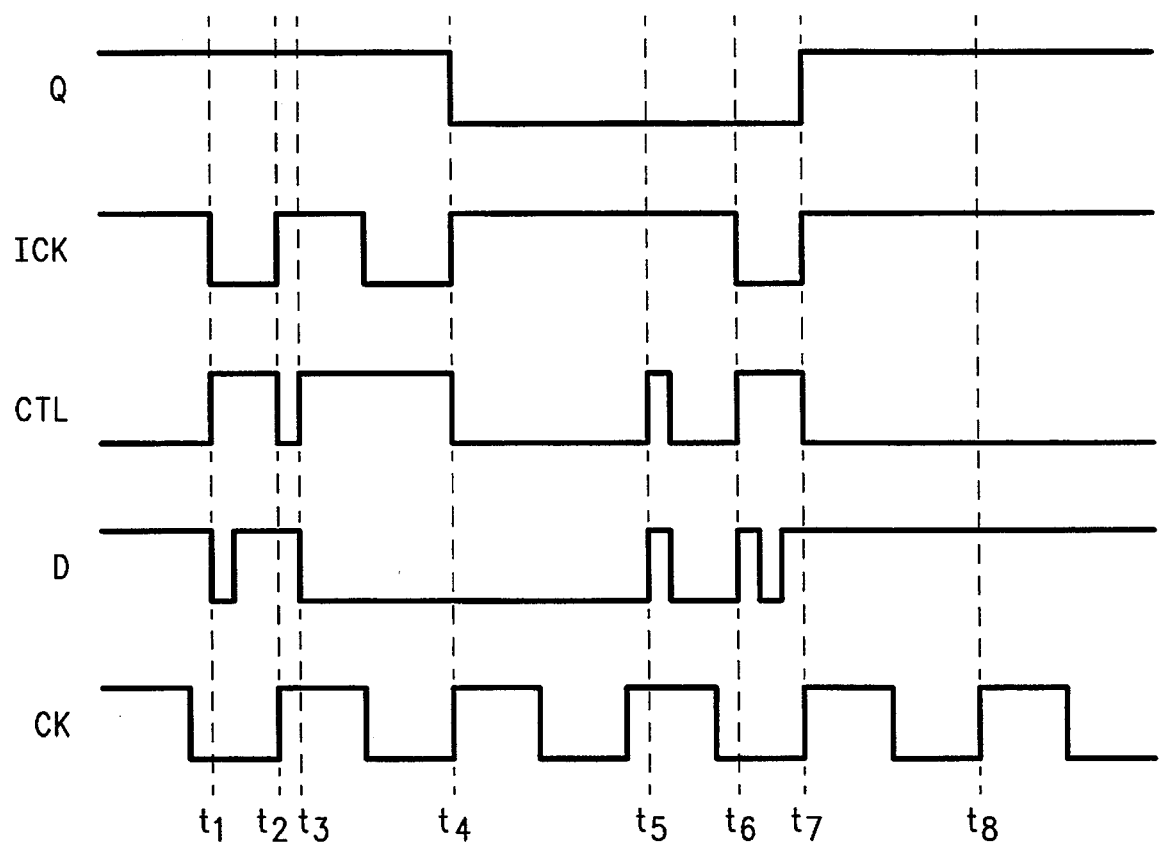
FIG. 5 illustrates a timing diagram for the switching circuitry of FIG. 4.

Consider a first example of switching circuit 60 operating where a spurious data signal D to flip-flop 10 occurs at time t1 of FIG. 5. Data D goes low and returns high during the low portion of CK before flip-flop 10 is clocked at the rising edge of CK. Output Q does not change until flip-flop 10 receives a falling edge of ICK. During the time that data D is different than output Q, the output of gate 42 is logic one by nature of its exclusive-OR function. The clock signal CK from inverter 11 is logic zero before time $t_1$. At time $t_1$, control signal $\overline{CTL}$ at the output of NOR gate 44 goes to logic zero and control signal CTL at the output of inverter 46 is logic one. The logic one CTL and logic zero $\overline{CTL}$ enable transmission gate 45 to pass clock signal CK. With CK at logic zero, ICK follows to logic zero and $\overline{CK}$ goes to logic one at the output of inverter 11 within flip-flop 10. The spurious data D switches back to logic one before the rising edge of CK at time $t_2$; however, CTL remains logic one from NOR gate 44 and inverter 46 because $\overline{CK}$ is latched at logic one by inverters 11 and 48. At time $t_2$, ICK clocks flip-flop 10 on its rising edge but output Q remains logic one because data D is logic one at time $t_2$. Thus, a spurious data signal before the clocking edge of CK causes flip-flop 10 to receive its clock and update its contents. ICK goes to logic one and $\overline{CK}$ returns to logic zero. CTL goes to logic zero to disable transmission gate 45 and block CK from flip-flop 10.

Next consider an example where data D goes low at time $t_3$ and stays low during the next rising edge of CK. Data D disagrees with output Q and CTL goes to logic one at time $t_3$ to enable transmission gate 45 and allow ICK to follow CK. When CK goes to logic zero, ICK also switches to logic zero and $\overline{CK}$ goes to logic one thereby holding CTL at logic one by way of NOR gate 44. At time $t_4$, CK goes high and the rising edge of ICK clocks flip-flop 10 to latch the new data. With ICK at logic one, $\overline{CK}$ returns to logic zero. Output Q goes to logic zero and CTL returns to logic zero as data D and output Q again agree. The output of exclusive-OR gate 42 is logic zero and $\overline{CTL}$ at the output of NOR gate 44 is logic one. Transmission gate 45 becomes disabled and blocks CK.

Between times $t_4$ and $t_5$, there is no change in data D. Control signal CTL remains logic zero and transmission gate 45 is open. At the rising edge of CK before time $t_5$, CK is blocked from flip-flop 10 because data D agrees with output Q, i.e. no new data is present.

Another example begins at time $t_5$ with a first spurious data signal D while CK is high, and another spurious data signal D at time $t_6$, when CK is low. CTL goes to logic one at time $t_5$ because data D disagrees with output Q. Transmission gate 45 is enabled while data D disagrees with output Q, but ICK does not change because CK is high. When data D returns to logic zero during the high portion of CK, it agrees with output Q and CTL goes to logic zero whereby transmission gate 45 becomes disabled. ICK does not follow the falling edge of CK because transmission gate 45 is disabled. The second time transmission gate 45 is enabled by data D disagreeing with output Q occurs at time $t_6$. ICK goes low because CK is already logic zero. Inverters 11 and 48 hold ICK at logic zero. When CK goes to logic zero, $\overline{CK}$ goes to logic one thereby holding CTL at logic one by way of NOR gate 44. Data D goes low and returns to logic one and stays there through the rising edge of CK. At time $t_7$, the rising edge of ICK clocks flip-flop 10 causing output Q to go to logic one as per data D. CTL returns to logic zero as data D and output Q again agree. Transmission gate 45 becomes disabled and blocks clock signal CK.

The next rising edge of CK at time $t_8$ has no effect on flip-flop 10 because data D agrees with output Q, i.e. no new data is present. CTL remains logic zero and transmission gate 45 blocks clock signal CK from reaching flip-flop 10. By not clocking flip-flop 10 unless new data is present, the capacitive power dissipation in flip-flop 10 is reduced.

Gate 44 and gate 48 in switching circuit 40 also ensure proper operation of the flip-flop in the presence of dynamic hazards. It can happen that dynamic hazards on data input terminal D can cause clocking terminal ICK of flip-flop 10 to go low when the clock CK is low. Under such conditions, gate 44 ensures that clocking terminal ICK of flip-flop 10 goes high only when clock CK goes high, thereby ensuring proper data latching. Since one of the data inputs to gate 44 is $\overline{CK}$, the output terminal of gate 44 produces a low control signal $\overline{CTL}$ which enables the transmission gate 45. Gate 44 produces a high control signal CTL to disable the transmission gate 45 only when signal $\overline{CK}$ goes low which is caused by CK going high, and the output of gate 42 goes low which is caused by input data being latched at the output terminal. It should be noted that the activity of gate 44 is minimized since it only activates for half a clock cycle when the data at the data input terminal D changes.

By now it should be appreciated that the present invention discloses a low power flip-flop circuit that reduces the dynamic power dissipation of a flip-flop. In a typical microcontroller application, 50% of total power is dissipated in the clock tree, and 25% (or 12.5% of the total) of this power is dissipated at the flip-flops. With the clock frequency approximately ten times (10×) the data frequency, the present circuitry provides at least a 9.4% total power saving. With the clock frequency approximately twenty times (20×) the data frequency, the present circuitry provides at least a 11.3% total power saving.

The switching circuit reduces power consumption in a flip-flop by blocking clock pulses during periods when the data input is not changing. Any clock pulse during periods when the data input is not changing consumes power without providing a useful function. A state sensing structure is used which connects the clock to the flip-flop only when new data needs to be latched. Otherwise, the clock is disconnected and the flip-flop does not dissipate dynamic power.

The disclosed implementation increases the area requirement for typical flip-flops; however, in power critical applications this area trade-off is well worth the power savings. Also, the additional transistors switch only when input data changes, thereby minimizing dynamic power dissipation. If no data changes, there is no dynamic power dissipation. The claimed structure can be used on any clocked flip-flop to exploit the relative data inactivity to significantly reduce the total power dissipation. It will be understood that the present low power flip-flop circuitry can be used in any circuits which use flip-flops implemented with field effect transistors, such as CMOS, CGaAs, etc.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A circuit for latching data, comprising:

a flip-flop having a data input coupled for receiving a data input signal, and a data output for providing a data output signal; and circuit means having first and second inputs coupled to said data input of said flip-flop and said data output of said flip-flop respectively for monitoring said data input signal and said data output signal and blocking a clock signal to a clock input of said flip-flop when said data input signal and said data output signal agree at a clocking edge of said clock signal.

2. The circuit of claim 1 wherein said circuit means includes:

an exclusive-OR gate having first and second inputs and an output, said first input being coupled to said data input of said flip-flop, said second input being coupled to said data output of said flip-flop;

a NOR gate having first and second inputs and an output, said first input being coupled to said output of said exclusive-OR gate, said second input being coupled for receiving an inverted clock signal; and a first transmission gate having first and second conduction terminals and a first control terminal, said first conduction terminal being coupled for receiving said clock signal, said second conduction terminal being coupled to said clock input of said flip-flop, said first control terminal being coupled to said output of said NOR gate.

3. The circuit of claim 2 wherein said circuit means further includes a first inverter having an input coupled to said output of said NOR gate and having an output coupled to a second control input of said transmission gate.

4. The circuit of claim 3 wherein said circuit means further includes a second inverter having an input coupled for receiving said inverted clock signal and having an output coupled to said second conduction terminal of said transmission gate.

5. The circuit of claim 1 wherein said circuit means includes:

a first gate having a control output terminal and a pair of data input terminals coupled to receive input data supplied at said data input of said flip-flop and output data at said data output of said flip-flop, respectively; and a second gate having a control input terminal coupled to said control output terminal of the first gate, a clock input terminal coupled for receive said clock signal, and a clock output terminal coupled to said clock input of said flip-flop and to supply said clock signal to said clock input of said flip-flop when a control signal is received at said control input terminal of said second gate.

6. The circuit of claim 5 wherein the first gate is an exclusive OR gate.

7. The circuit of claim 6 wherein the second gate is a transmission gate.

8. The circuit of claim 7 further including an inverter having an input coupled to said control output terminal of said first gate and having an output coupled to a second control terminal of said second gate.

9. The circuit of claim 8 further including:

a third gate having a control input terminal coupled to said clock output terminal of said second gate, a clock input terminal coupled for receive said clock signal, and a clock output terminal;

a fourth gate having a pair of data input terminals coupled to said clock output terminal of said third gate and a data output terminal; and a transistor coupled between a potential source and said clock input terminal of said flip-flop, said transistor having a control terminal coupled to said data output terminal of said fourth gate.

10. The circuit of claim 9 wherein said third gate further includes an inverted control input terminal coupled to receive an inverted clock signal from an inverted clock output terminal of said flip-flop.

11. The circuit of claim 10 wherein said third gate is a transmission gate.

12. The circuit of claim 9 wherein the fourth gate is a NAND gate and one of said data input terminals is coupled to said data output terminal of said third gate through an inverter.

13. A method of clocking a circuit for latching data, comprising the steps of:

providing a flip-flop having a data input coupled for receiving a data input signal, and a data output for providing a data output signal;

comparing said data input signal and said data output signal of said flip-flop;

passing a clock signal to a clock input of said flip-flop when said data input signal and said data output signal of said flip-flop disagree; and blocking a clock signal to said clock input of said flip-flop when said data input signal and said data output signal of said flip-flop agree at a clocking edge of said clock signal.

14. A circuit for latching data, comprising:

a flip-flop having a data input coupled for receiving a data input signal, and a data output for providing a data output signal;

an exclusive-OR gate having first and second inputs and an output, said first input being coupled to said data input of said flip-flop, said second input being coupled to said data output of said flip-flop;

a NOR gate having first and second inputs and an output, said first input being coupled to said output of said exclusive-OR gate, said second input being coupled for receiving an inverted clock signal; and a first transmission gate having first and second conduction terminals and a first control terminal, said first conduction terminal being coupled for receiving said clock signal, said second conduction terminal being coupled to a clock input of said flip-flop, said first control terminal being coupled to said output of said NOR gate.

15. The circuit of claim 14 further including a first inverter having an input coupled to said output of said NOR gate and having an output coupled to a second control input of said transmission gate.

16. The circuit of claim 14 further including a second inverter having an input coupled for receiving said inverted clock signal and having an output coupled to said second conduction terminal of said transmission gate.

* * * * *